(12) United States Patent
Swift et al.

(10) Patent No.: US 7,317,222 B2
(45) Date of Patent: Jan. 8, 2008

(54) MEMORY CELL USING A DIELECTRIC HAVING NON-UNIFORM THICKNESS

(75) Inventors: Craig T. Swift, Austin, TX (US); Gowrishankar L. Chindalore, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/341,813

(22) Filed: Jan. 27, 2006

(65) Prior Publication Data

US 2007/0176226 A1 Aug. 2, 2007

(51) Int. Cl.
*H01L 29/792* (2006.01)
(52) U.S. Cl. .................. 257/324; 257/213; 257/288; 257/314; 257/E29.309
(58) Field of Classification Search .............. None
See application file for complete search history.

(56) References Cited

U.S. PATENT DOCUMENTS

| | | | | |
|---|---|---|---|---|
| 5,191,556 | A * | 3/1993 | Radjy | 365/185.33 |
| 6,735,123 | B1 * | 5/2004 | Tripsas et al. | 365/185.26 |
| 6,898,128 | B2 | 5/2005 | Prinz et al. | |
| 6,963,508 | B1 | 11/2005 | Shone | |
| 7,209,390 | B2 | 4/2007 | Lue et al. | |
| 2002/0149081 | A1 * | 10/2002 | Goda et al. | 257/510 |
| 2004/0188753 | A1 * | 9/2004 | Kawashima et al. | 257/316 |
| 2005/0205923 | A1 * | 9/2005 | Han et al. | 257/315 |
| 2005/0227437 | A1 * | 10/2005 | Dong et al. | 438/265 |

OTHER PUBLICATIONS

Chan, T. Y. et al.; "A True Single-Transistor Oxide-Nitride-Oxide EEPROM Device"; IEEE Electronic Device Letters; Mar. 1987; pp. 93-95; vol. EDL-8, No. 3; IEEE.

* cited by examiner

*Primary Examiner*—Sue A. Purvis
*Assistant Examiner*—Kevin Quinto
(74) *Attorney, Agent, or Firm*—Robert L. King; Joanna G. Chiu

(57) ABSTRACT

A memory cell is programmed by injecting charge into a charge storage layer of the memory cell. A desired programmed charge results in the charge storage layer over an edge portion of a channel region of the memory cell. An undesired programmed charge results in the charge storage layer over an inner portion of the channel region. Charge tunneling is used to substantially remove the undesired programmed charge in the charge storage layer. In one form the memory cell has a substrate having a channel region, a first dielectric layer over the substrate and a charge storage layer over the first dielectric layer. A second dielectric layer over the charge storage layer has a first portion that is thicker than a second portion to selectively control the charge tunneling.

22 Claims, 11 Drawing Sheets

MEMORY CELL USING A DIELECTRIC HAVING NON-UNIFORM THICKNESS

CROSS REFERENCE TO RELATED APPLICATION

This application is related to the following pending application:

(1) U.S. Ser. No. 11/341,809 entitled "Method for Multiple Step Programming A Memory Cell" by Swift et al., filed of even date herewith and assigned to the assignee of record herein.

FIELD OF THE INVENTION

This invention relates generally to semiconductor devices, and more specifically, to nonvolatile memory devices and methods of manufacture.

BACKGROUND OF THE INVENTION

Non-volatile memories that use discrete charge storage elements, such as electron and hole traps in nitride, are programmed typically by inserting electrons into the discrete charge storage elements. Because the storage medium is non-conductive, there is little movement of the electrons within the storage medium. One of the typical and most effective ways of inserting electrons into the nitride is hot carrier injection (HCI). This has the effect of injecting electrons into the nitride in a non-uniform manner. The charge density is highest where the electrons are the most energetic, which is typically near the drain. The result is that the electrons are more concentrated in the nitride in the area closest to the drain. This is effective for providing a sufficient change in threshold voltage of the memory cell to be detectible.

Another technique is hot hole injection. This provides for holes being injected into the nitride to neutralize the electrons in the nitride. The hot holes are also created near the drain by providing a reverse bias on the PN junction and a negative voltage on the control gate. These bias conditions cause the formation of hole/electron pairs. Some of these holes are accelerated between the drain and the substrate to sufficient energy to surmount the potential barrier between the substrate and the nitride. The holes that are able to reach the nitride do so according to a pattern. Although this pattern is similar to that for the programming using HCI, it is not the same. T. Y. Chan et al. in "A True Single-Transistor Oxide-Nitride-Oxide EEPROM Device", IEEE Electron Device Letters, Vol. EDL-8, No. 3, March 1987, describe memory programming with a simultaneous high gate voltage and drain voltage which creates a saturation condition for the transistor. Programming in the saturation condition creates an electron distribution that is localized in the drain with a relatively wide distribution. This programming uses HCI and tends to have not just one peak near the drain but also an additional peak a little further from the drain. Hot hole injection (HHI) does not tend to have this second peak so that the electrons injected as part of the second peak are not completely neutralized very effectively by HHI. Thus, electrons tend to be left in the nitride when using HHI erase. After write/erase cycling, the accumulated electrons cause the erased threshold voltage to increase, leading to insufficient voltage margins for memory operation.

A narrow electron distribution allows the storage of two discrete data states within a single memory cell. An independent data state may be stored at each of the two source/drain terminals without substantial cross-interference between the two bits in the memory cell. However, use of the high program gate voltage necessary for creating narrow electron distributions requires large peripheral transistors capable of handling such high gate voltages. In order to withstand gate voltages such as ten volts, the transistors must use a thick gate oxide that directly increases the size of the required peripheral circuitry. Existing non-volatile memory modules that use a storage medium layer with a gate bias sufficiently high for charge localization typically have a size disadvantage especially when fast read access time is required.

BRIEF DESCRIPTION OF THE DRAWINGS

The present invention is illustrated by way of example and not limited to the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
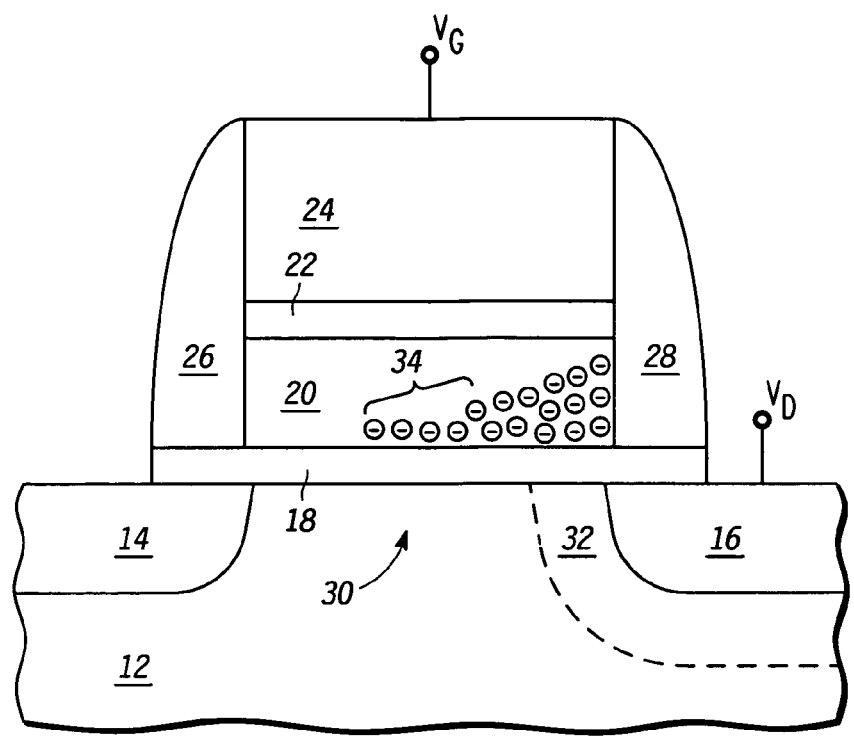
FIG. 1 illustrates in cross-sectional form a memory cell having an undesired charge storage distribution in the channel thereof.

Illustrated in FIG. 1 is a semiconductor device having an NVM (nonvolatile memory) cell or memory cell 10. The memory cell 10 has a substrate 12 which is formed of any of several semiconductor materials. Typically substrate 12 is silicon. Within the substrate 12 is a source 14 and a drain 16 that are separated by a channel region 30. Overlying the channel region is a gate structure having a gate 24. A bottom dielectric layer 18 is formed over the channel region 30 and a portion of the source 14 and the drain 16. Overlying the bottom dielectric layer 18 is a charge storage layer 20. The charge storage layer 20 has a plurality of charge storage elements. The stored charge in these charge storage elements is situated in an unbalanced distribution that includes a charge distribution tail 34. In one form the charge storage layer 20 is nitride. Overlying the charge storage layer 20 is a top dielectric layer 22. In one form the bottom dielectric layer 18 and the top dielectric layer 22 is an oxide. Overlying the top dielectric layer 22 is gate 24. Adjacent the sides of the gate structure and overlying a portion of the bottom dielectric layer 18 are sidewall spacers 26 and 28. An electrical contact is connected to the gate 24 for applying a gate voltage $V_G$ and an electrical contact is connected to the drain 16 for applying a drain voltage $V_D$.

When the memory cell 10 is programmed by hot carrier injection by applying a gate voltage with a fixed potential on the source and drain and a bias on the substrate 12 (i.e. the well), a desired amount of charge injection occurs at an edge of the channel region 30. Also, an undesired amount of charge injection can result in an interior portion of the channel region 30 as a result of bias conditions to create the charge distribution tail 34. The creation of both a desired and an undesired amount of charge injection results in the illustrated stored charge distribution. The undesired charge injection in the interior of the memory cell 10 may interfere with the proper read operation of a multiple-bit per cell memory as well as a single-bit per cell memory. Therefore, the FIG. 1 illustration is intended to be exemplary for either type of memory cell structure. In both structures, the build-up of undesired charge may make an erased cell appear to have been programmed. For example, for single-bit cells and multiple-bit cells, the selected bit appears to remain programmed even after it has been erased by a non-uniform erase technique, such as hot hole injection. For a multiple-bit memory cell implementation, errors may occur from this undesired charge when reading the adjacent bit in the memory cell that was not programmed. For example, FIG. 1 shows that there is a charge existing outside the shielding effect of a depletion region 32 adjacent drain 16 during a read. Undesired charge in the interior portion of memory cell 10 will have an unwanted influence on the channel region 30 during a read of the un-programmed bit in the memory cell 10.

Figure 2:
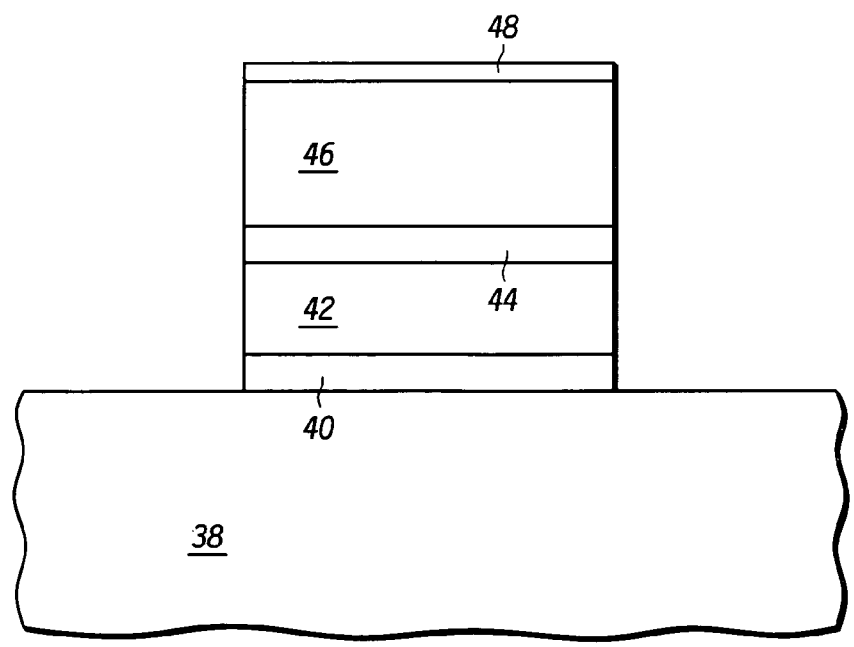
FIGS. 2-7 illustrate in cross-sectional form a memory cell using multiple step programming in accordance with one form of the present invention.

Illustrated in FIG. 2 is initial formation of a memory cell 36 and a method associated with forming memory cell 36. A substrate 38 is provided wherein substrate 38 may be any of various semiconductor materials and is typically silicon. A bottom dielectric layer 40 is formed over a portion of substrate 38. In one form the bottom dielectric layer 40 is an oxide. Overlying the bottom dielectric layer 40 is a charge storage layer 42. In one form the charge storage layer 42 is a nitride layer. Overlying the charge storage layer 42 is a top dielectric layer 44. In one form the top dielectric layer 44 is an oxide. Overlying the top dielectric layer 44 is a gate 46 which has a desired width sufficient to define a channel of memory cell 36. In one form gate 46 is polysilicon, but various other semiconductor and conductive materials may be used. Overlying the gate 46 is an antireflective coating (ARC) layer 48.

In the illustrated form of FIG. 2, a memory cell gate stack has been created through conventional etching techniques of the bottom dielectric layer 40, the charge storage layer 42, the top dielectric layer 44, the gate 46 and the ARC layer 48. The charge storage layer 42 is separated from the substrate 38 and the gate 46 by electrically insulating layers and may be controlled by a bias voltage applied to the gate 46.

Figure 3:
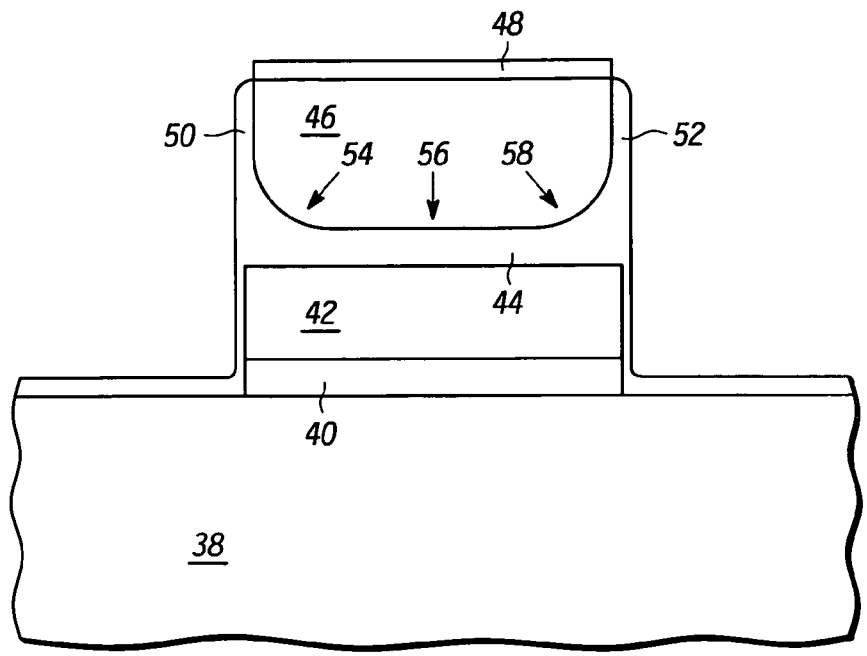

Illustrated in FIG. 3 is further processing of memory cell 36. The gate stack is exposed to a conventional oxidizing ambient that is sufficiently aggressive to consume gate material of gate 46. As a result of the consumption of gate material, the resulting gate oxide thickness of the top dielectric layer 44 at the edge of the stack increases and is thicker than that at the center of the top dielectric layer 44. The extent of the oxide thickening should be similar to the width of the desired programmed charge distribution. Therefore, the time of exposure of memory cell 36 to the oxidizing ambient is set according to a desired thickness of the edge of the top dielectric layer 44. The oxidizing ambient creates a sidewall oxide 50 and a sidewall oxide 52. In the illustrated form, the edge thickness 54 and edge thickness 58 of the top dielectric layer 44 is illustrated as being greater than the inner thickness 56 of the top dielectric layer 44.

Figure 4:
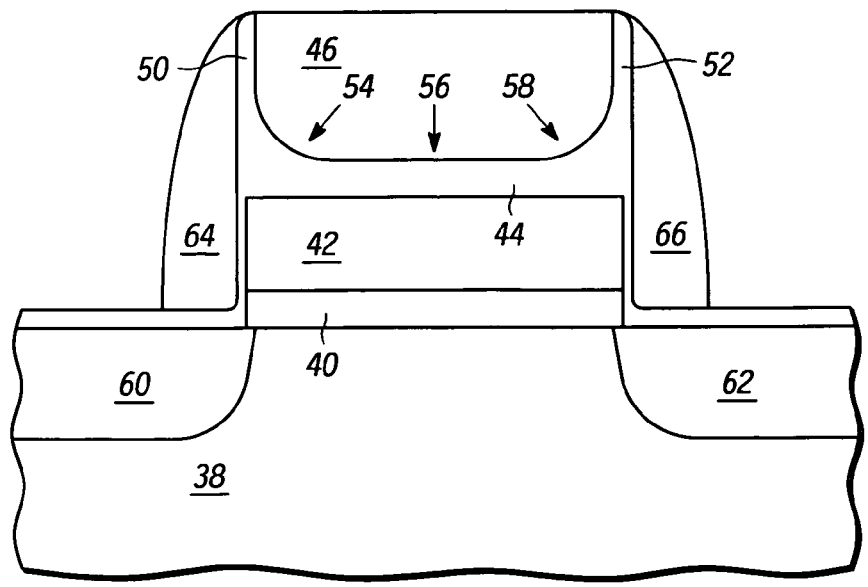

Illustrated in FIG. 4 is further processing of memory cell 36. A source 60 and a drain 62 are formed by ion implantation adjacent the gate stack structure to define a channel within the substrate 38 underlying the gate 46. Additionally, sidewall spacer 64 and sidewall spacer 66 are formed and patterned as a continuous spacer structure around the gate stack of memory cell 36. In one form the sidewall spacers 64 and 66 are formed of nitride. Prior to the formation of sidewall spacers 64 and 66, the ARC layer 48 is removed to expose the gate 46.

Figure 5:
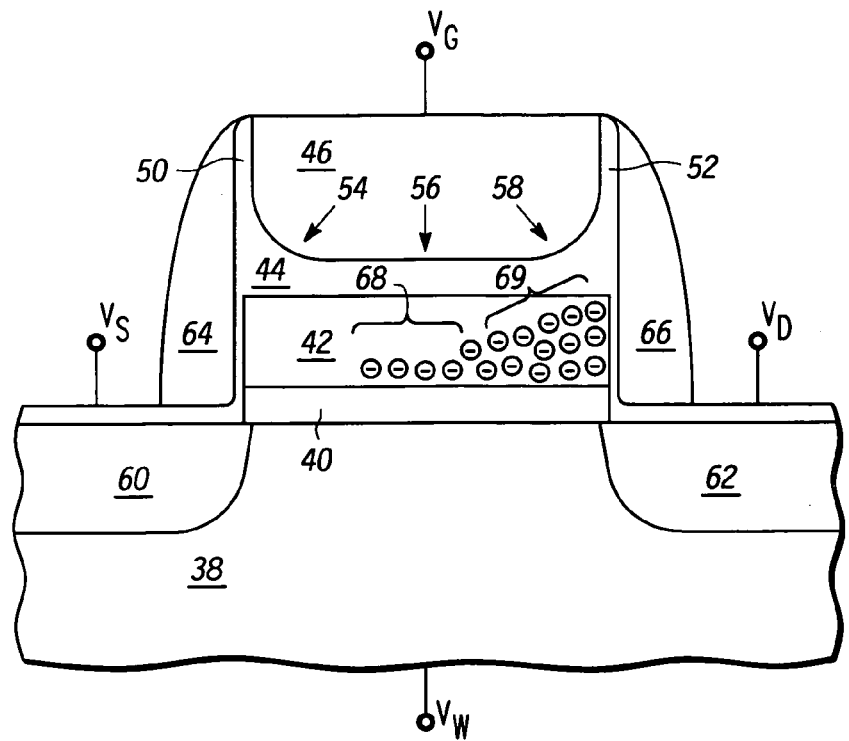

Illustrated in FIG. 5 is further processing of memory cell 36 wherein electrical contact to gate 46, source 60, drain 62 and substrate 38 has been made. A source bias voltage $V_S$ is connected to source 60. A gate bias voltage $V_G$ is connected to gate 46. A drain bias voltage $V_D$ is connected to drain 62. A well voltage $V_W$ is connected to the substrate 38. Assume an exemplary biasing condition for a program operation of memory cell 36 of six volts for the gate, three volts for the drain and negative two volts for the well voltage. In this example bias condition, a charge distribution as illustrated in FIG. 5 results within the charge storage layer 42. A desired programming charge 69 is provided wherein most of the charge is present at the edge or lateral periphery of the charge storage layer 42 adjacent the drain 62. The charge distribution tapers toward the center of the memory cell 36. However, an undesired charge distribution tail 68 also is present in the central area of charge storage layer 42. The charge distribution tail 68 is undesirable as mentioned previously and may result in the memory cell to appear to have been programmed when it was not. It should be noted that in this embodiments and others disclosed herein that the polarity of the gate voltage with respect to the substrate 38 may be either positive as discussed above or negative. The gate polarity depends upon which of the bottom dielectric layer 40 or the top dielectric layer 44 is thicker at the periphery or edge of gate 46. When the top dielectric layer 44 is thicker than the bottom dielectric layer at the edge of gate 46 as illustrated in FIG. 5, the gate voltage is positive with respect to substrate 38.

Figure 6:
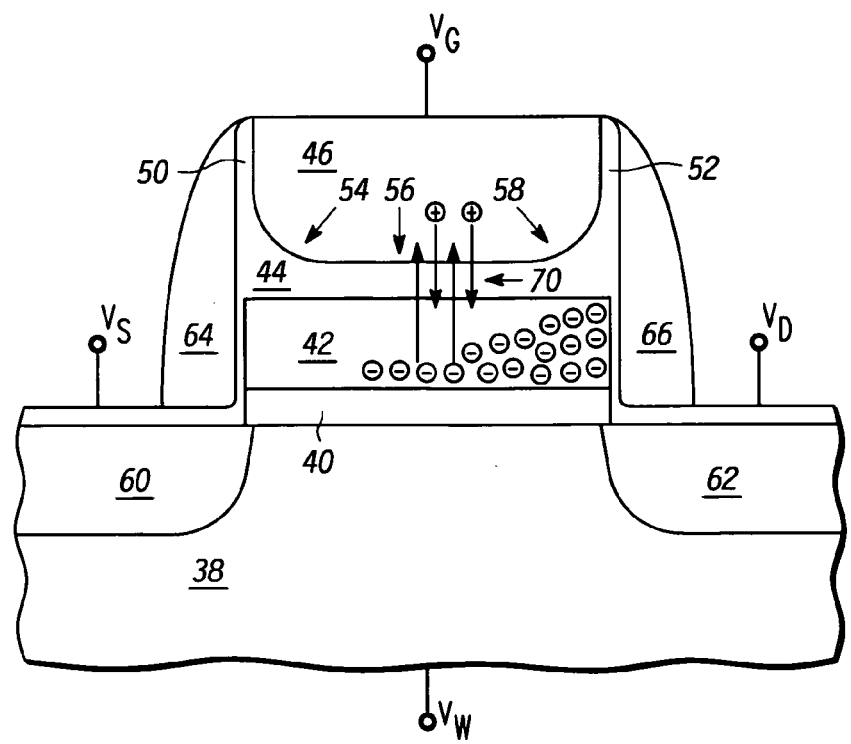

Illustrated in FIG. 6 is an additional programming step that corrects or compensates for the charge distribution tail 68 of FIG. 5. In this operation, a second step to program the memory bit on the right-hand side of memory cell 36 is performed. The second step is used to clean up the undesired charge in charge distribution tail 68 in the interior region overlying the channel. In one form, a gate bias voltage of approximately seven volts is used for $V_G$. A bias voltage of approximately negative seven volts is used as voltage $V_W$, $V_D$ and $V_S$. Under these bias conditions, the undesired charge is substantially removed by tunneling of electrons as indicated by the arrows in FIG. 6 from charge storage layer 42 to the gate 46. The electron tunneling occurs where the field is highest due to the top dielectric layer 44 being thinner in the center of the top dielectric layer 44 than at the edges. Similarly, holes may be injected from the gate 46 into the charge storage layer 42 in the central portion of memory cell 36. As a result, the undesired charge in the interior portion of the charge storage layer 42 is reduced to an amount that has a significantly less influence on the reading of the memory cell 36. The tunneling in the thicker regions of the top dielectric layer 44 is minimal so that the charge presently existing in those regions is not significantly changed.

In the illustrated form the total voltage between the gate 46 and substrate 38 may be in a range from nine to twenty volts. It must be low enough that the support circuitry (not shown) in the periphery is minimized in cost. If the voltage differential is too high, the desired charge within charge storage layer 42 may be modified. However, if the voltage between gate 46 and substrate 38 during the "clean-up" programming step is too low, the tunneling of the undesired charge may be too slow or ineffective. Voltage ranges between 12 and 14 volts total magnitude are typical for conventional processes. However, it should be understood that this range will vary depending upon process parameters and device configuration.

Figure 7:
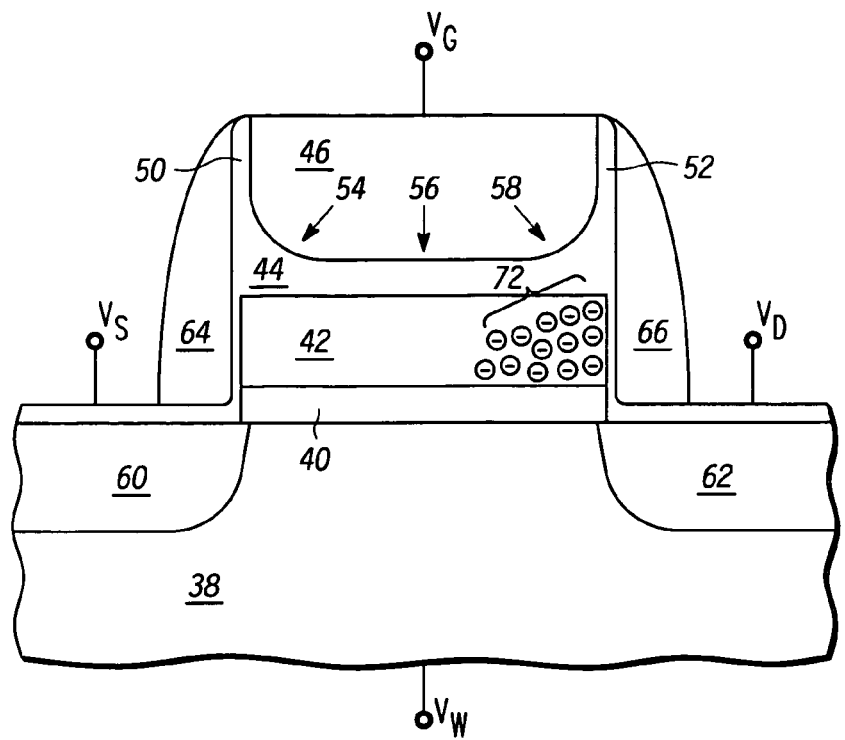

Illustrated in FIG. 7 is a programmed memory cell 36. A resulting programmed charge 72 is illustrated wherein the stored charge in the charge storage layer 42 is concentrated much more effectively at the edge or periphery of the charge storage layer 42 adjacent the drain 62. Structurally, memory cell 36 has a varying gate dielectric thickness between the charge storage layer 42 and the gate 46. In particular, the dielectric thickness has been intentionally made thinner in the center of memory cell 36 to permit electron tunneling in the second programming step whereas the electron tunneling in inhibited outside of the central area by an increased thickness of the top dielectric layer 44.

Figure 8:
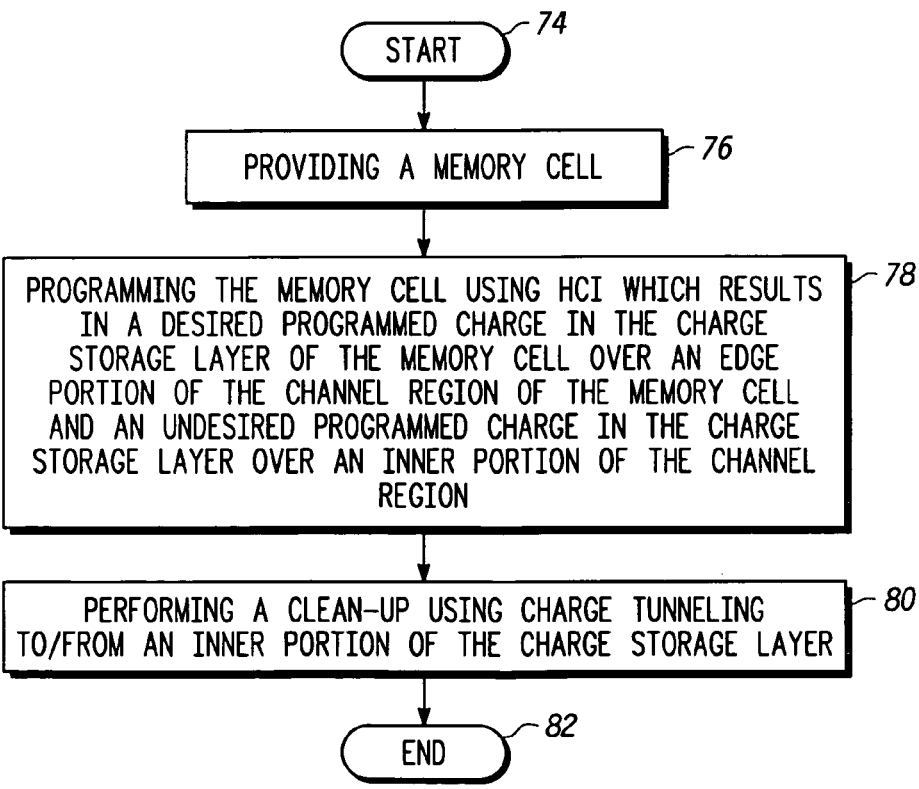
FIG. 8 illustrates in flow chart form a method of multiple step programming of a memory cell.

Illustrated in FIG. 8 is a flowchart of a method for multiple step programming of a memory in accordance with one form the present invention. After a start step 74, a memory cell is provided in a step 76. In a step 78 the memory cell is programmed using hot carrier injection (HCI) which results in a desired programmed charge in the charge storage layer of the memory cell over an edge portion of the channel region of the memory cell. An undesired programmed charge in the charge storage layer over an inner portion of the channel region also results during programming. In a step 80 a clean-up is performed using charge tunneling to and/or from an inner portion of the charge storage layer. In a step 82 the programming is completed and an end of programming of the cell occurs.

Figure 9:
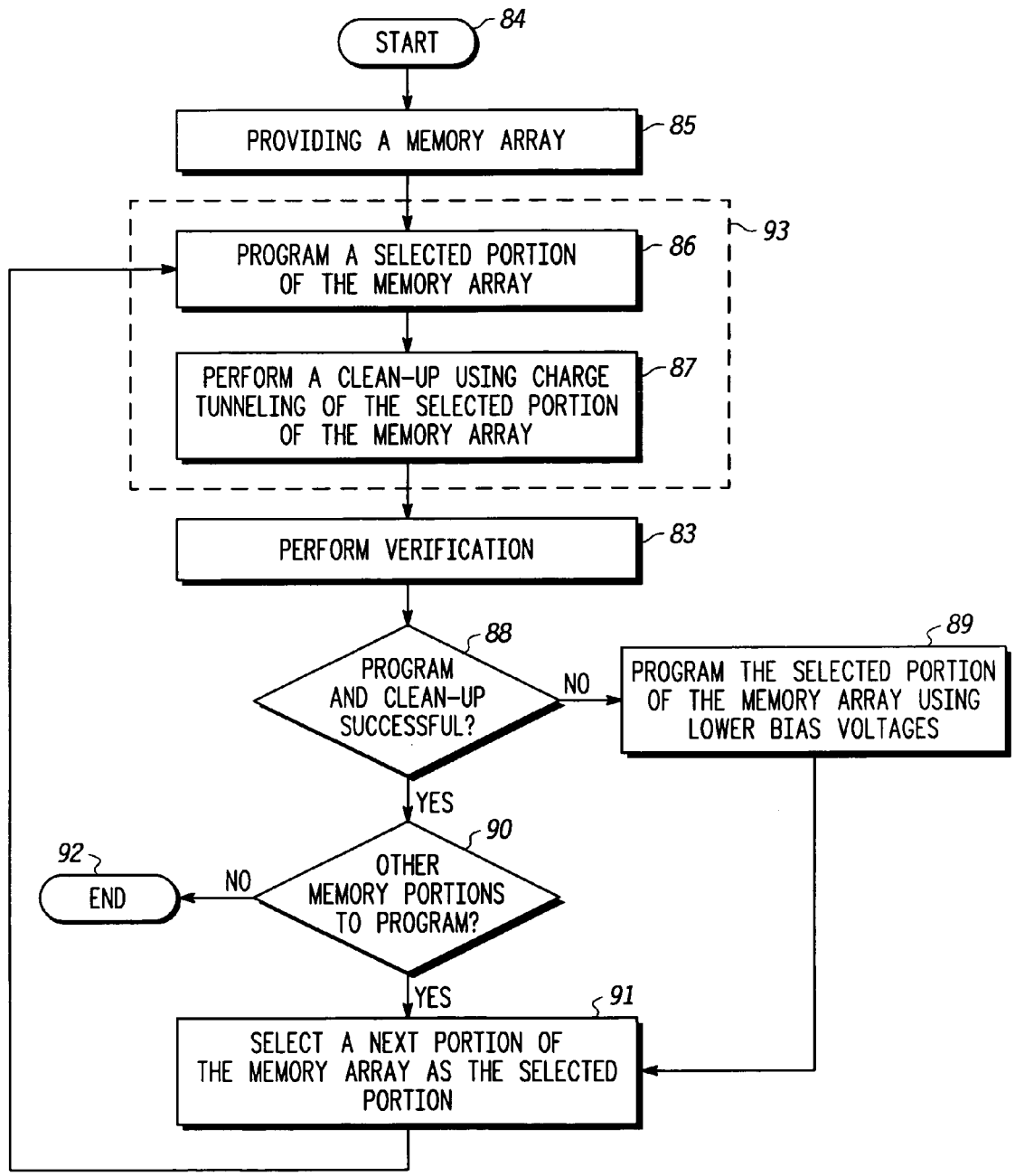
FIG. 9 illustrates in flow chart form a method of programming a memory array using multiple step programming.

Illustrated in FIG. 9 is a flowchart of a method of programming a memory array using multiple step programming. After a start step 84, a memory array is provided in a step 85. A two-step program 93 is then performed. Initially in a step 86 a selected portion of the memory array is programmed. In a second step, step 87, a clean-up is performed using charge tunneling of the selected portion of the memory array. After the two-step program 93, verification is performed in a step 83. In a step 88 a determination is made whether the program and clean-up of undesired charge in the interior region overlying the channel of each of the memory cell devices in the selected portion of the memory array was successful. If the clean-up was successful a determination is made in a step 90 as to whether other memory portions of the memory array should be programmed. If not, the programming ends with a step 92. If there is additional programming of the array to be performed, a step 91 is performed wherein a next portion of the memory array is selected as a selected portion. If the program and clean-up step 88 is not successful, a step 89 is performed wherein the selected portion of the memory array is programmed using lower bias voltages prior to performing step 91. After step 91, the programming continues with another iteration of the two step program 93 and the subsequent steps as described above.

Figure 10:
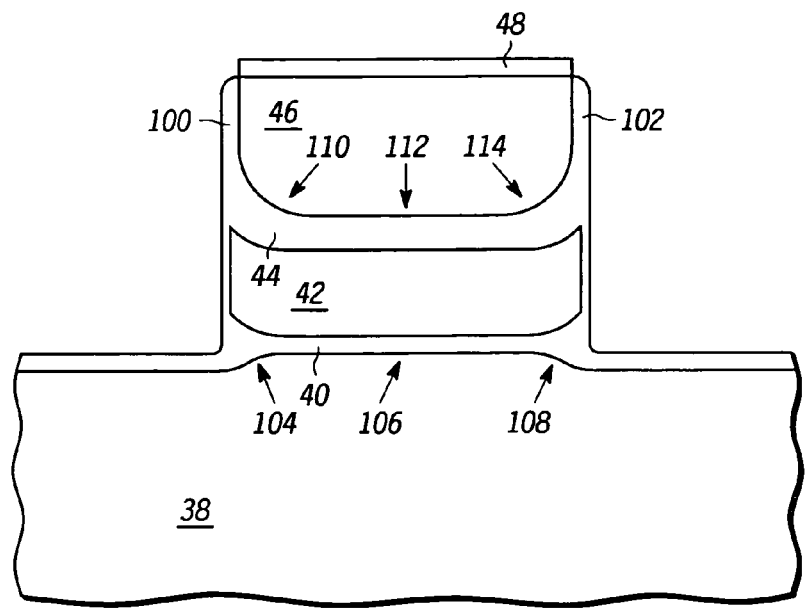
FIG. 10 illustrates in cross-sectional form another form of a memory cell using multiple step programming.

Illustrated in FIG. 10 in cross-sectional form is another form of a memory cell 36' using multiple step programming. For convenience of explanation elements that are similar to the form of memory cell 36 are similarly numbered. In the illustrated form memory cell 36' has both upper and lower increased oxide thickness at the edges of charge storage layer 42. Sidewall liners 100 and 102 are formed at the time the oxidation occurs which consumes a portion of the charge storage layer 42 at the edges. Oxidation creates an increased edge oxide thickness 104 and an increased edge oxide thickness 108 of the bottom dielectric layer 40. An inner oxide thickness 106 of the bottom dielectric layer 40 is noticeably thinner than the edge oxide thicknesses 104 and 106. Similarly, the top dielectric layer 44 has increased edge oxide thickness 110 and increased edge oxide thickness 114 whereas an inner oxide thickness 112 is less than the edge oxide thicknesses 110 and 114. A curvature to the upper and lower edge surfaces of the charge storage layer 42 is created as a result of the oxidation. The level of oxygen diffusion that occurs is dependent on the oxide thickness of the bottom dielectric layer 40 and the top dielectric layer 44. There are two significant factors that control whether there is significant oxidation at the edge of the bottom oxide layer. Firstly is the level of oxygen diffusion. Secondly the oxidation rate is not inhibited from stress from the overlying layers but a small dimension of the bottom dielectric layer 40 does inherently inhibit diffusion. When oxidation does occur at the edge of the bottom dielectric layer 40, the volume increase from the oxidation pushes the charge storage layer upward resulting in the structure of FIG. 10. It should be appreciated that the two areas of increased oxidation at each edge of the charge storage layer 42 may result in a lower voltage range of operation required during the second programming step, step 87. In other words the program voltage required at the gate 46 is lower in relation to the voltage required at the substrate 38 and the source and drain which are perpendicular to the view of FIG. 10 and therefore not visible.

Figure 11:
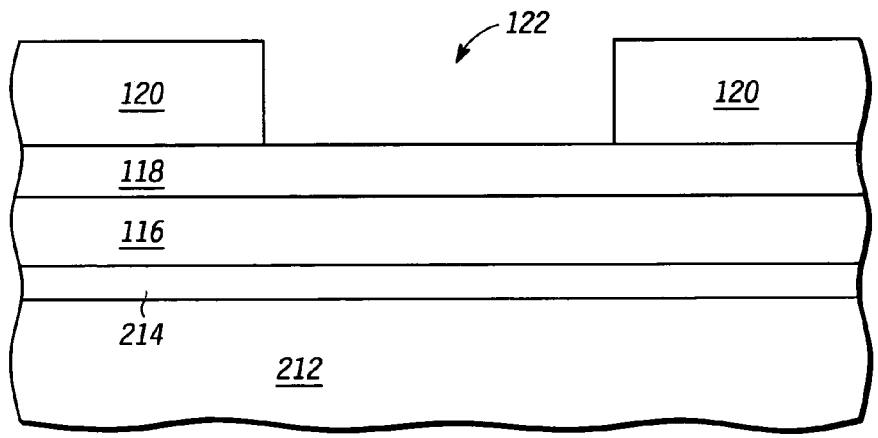
FIGS. 11-15 illustrate in cross-sectional form another form of making a gate stack structure of a memory cell that is programmed with multiple steps.

Illustrated in FIG. 11 is a cross-section of another memory cell, memory cell 111, which is programmed in multiple steps. Memory cell 111 is formed by providing a substrate 212. Overlying the substrate 212 is an oxide layer 214. Overlying the oxide layer 214 is a nitride layer 116. Overlying the nitride layer 116 is an oxide layer 118. Overlying the oxide layer 118 is a patterned masking layer 120 having an opening 122. In one form the patterned masking layer 120 is formed of nitride, but other materials may be used to implement a mask.

Figure 12:
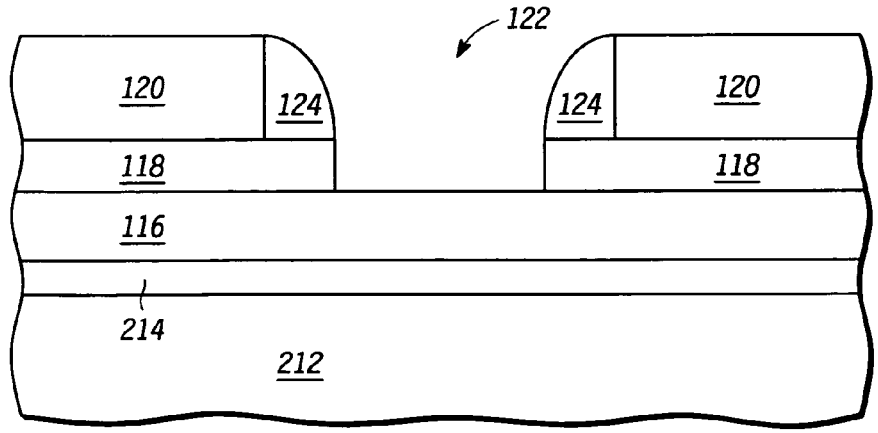

In FIG. 12 sidewall spacers 124 are formed along the sidewall of the patterned masking layer 120. Sidewall spacers 124 are formed with a continuous material along the side of the patterned masking layer 120 within the opening 122, but appear in two areas in this cross-sectional view. In one form the sidewall spacers 124 are formed of polysilicon. With the sidewall spacer 124 in place, the remaining exposed portion of oxide layer 118 within opening 122 is removed. Removal in one form is accomplished by a conventional wet etch.

Figure 13:
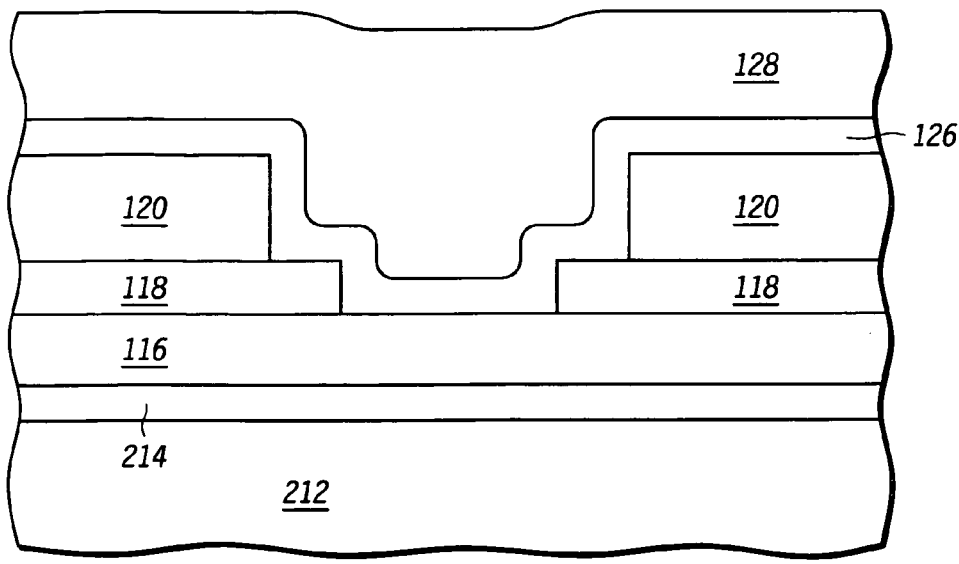

Illustrated in FIG. 13 is further processing of memory cell 111. The sidewall spacers 124 of FIG. 12 are removed. Upon removal of the sidewall spacers 124, a conformal oxide layer 126 is formed overlying memory cell 111. The oxide layer 126 may be formed by deposition of an oxide material or alternatively may be formed by conventional thermal oxidation. Additionally, a conductive layer of material to function as a gate 128 is deposited. In one form gate 128 is formed using polysilicon. However, other conductive materials may be used.

Figure 14:
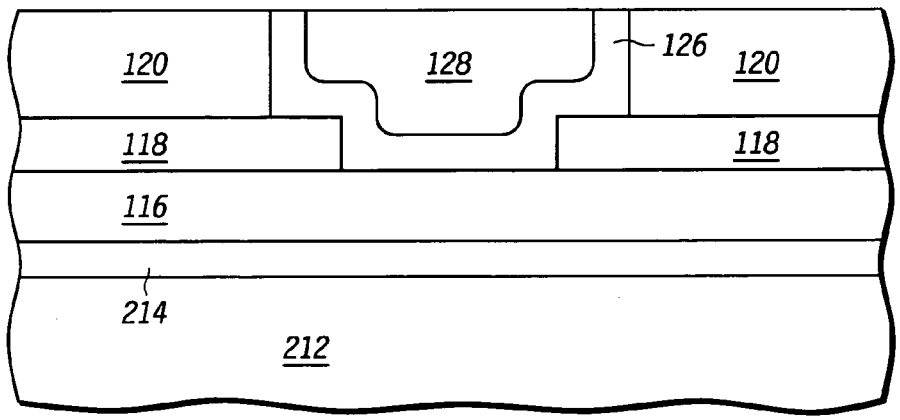

Illustrated in FIG. 14 is further processing of memory cell 111. Portions of the gate 128 are removed by removing the material of gate 128 that exists at a height greater than the top height of oxide layer 126. In particular, removal of a portion of gate 128 is implemented by using a chemical mechanical polish (CMP) process. The resulting structure for memory cell 111 is as illustrated in FIG. 14. All of the gate material of gate 128 that exists above the patterned masking layer 120 is removed by the CMP removal step.

Figure 15:
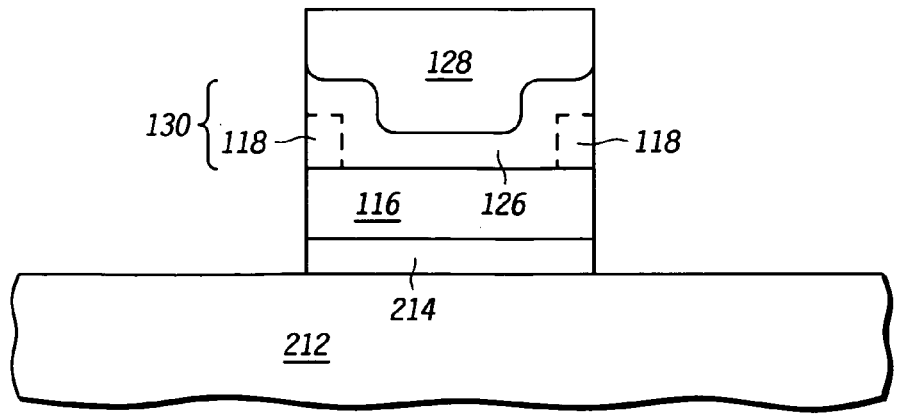

Illustrated in FIG. 15 is further processing of memory cell 111. A gate stack structure is created by using a conventional anisotropic dry etch with a mask (not shown) to form memory cell 111 as illustrated. In particular, the patterned masking layer 120 is removed in addition to portions of the oxide layer 118, the nitride layer 116 and the oxide layer 214 being removed. Also, the portion of oxide layer 126 that is laterally adjacent to an upper portion of the gate 128 is removed. In another embodiment, the remaining portion of gate layer 128 serves as a hard mask during the removal of the patterned masking layer 120, the oxide layer 118, the nitride layer 116 and the oxide layer 214. In this alternate embodiment, no additional mask patterning is necessary. The remaining portion of oxide layer 126 that underlies gate 128 has a smaller thickness in the central portion thereof than at the edges. At the perimeter of the gate stack an oxide thickness 130 exists that includes the thickness of oxide layer 118 combined with the thickness of oxide layer 126. Because both materials are an oxide and are therefore indistinguishable in physical characteristics, the remaining portion of oxide layer 118 is illustrated with a dashed line. It should therefore be noted that only the upper oxide, oxide layer 126, and not the lower oxide, oxide layer 214, has been modified in thickness using this embodiment and that the modification of oxide layer 126 thickness was accomplished via a masking step. Because memory cell 111 has a gate oxide with an edge thickness that is greater than the center thickness, the previously described multiple step programming method may be used with memory cell 111 for improved programming reliability.

Figure 16:
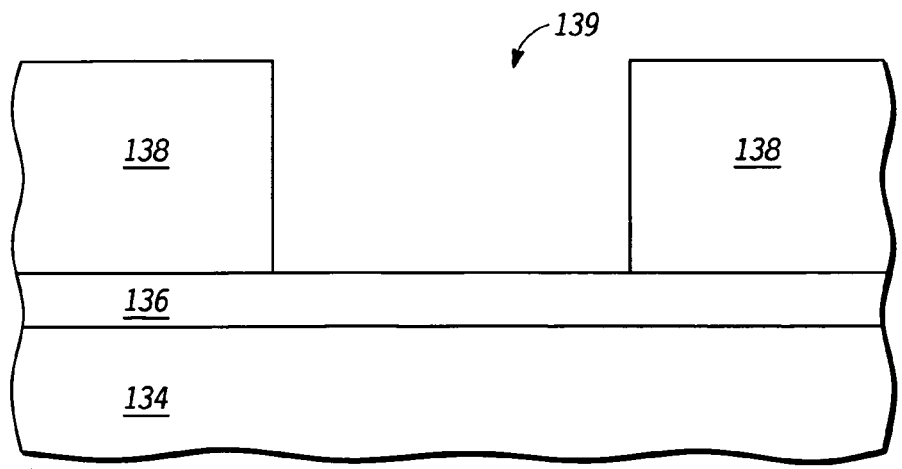
FIGS. 16-20 illustrate in cross-sectional form another form of making a gate stack structure of a memory cell that is programmed with multiple steps.

Illustrated in FIG. 16 is a memory cell 132 in which both an upper oxide layer and a lower oxide layer will have varying thicknesses when comparing an edge region and a central region. In particular, a substrate 134 is provided with an overlying bottom oxide layer 136. A patterned masking layer 138 is formed overlying the bottom oxide layer 136 and has an opening 139.

Figure 17:
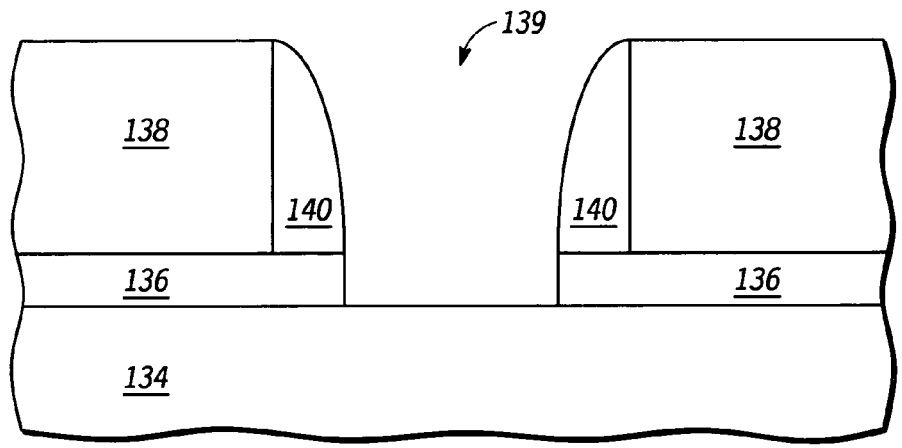

Illustrated in FIG. 17 is further processing of memory cell 132. Sidewall spacers 140 are formed on the sidewalls of the patterned masking layer 138 within the opening 139. Additionally, the remaining exposed portion of the bottom oxide layer 136 is removed. Sidewall spacers 140 are formed with a continuous material along the side of the patterned masking layer 138 within the opening 139, but appear in two areas in this cross-sectional view. In one form the sidewall spacers 140 are nitride spacers. The removal of the exposed portion of the bottom oxide layer 136 is by a conventional wet etch.

Figure 18:
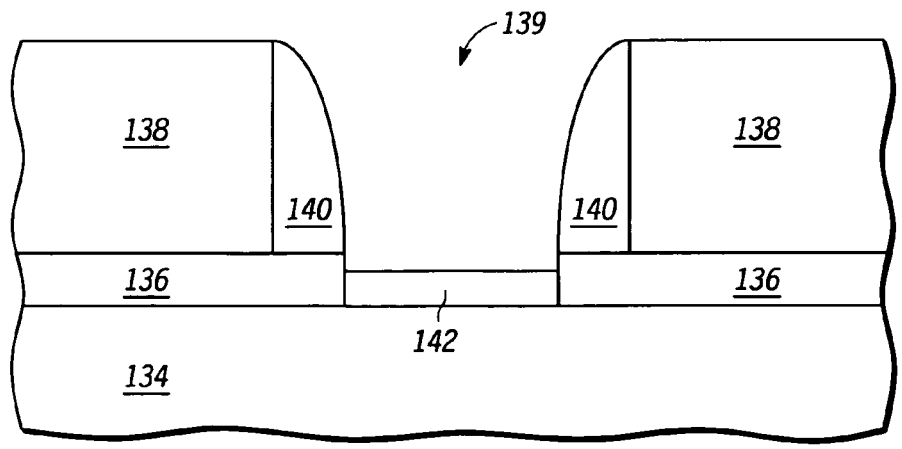

Illustrated in FIG. 18 is further processing of memory cell 132. In particular, a bottom oxide layer 142 is formed within opening 139 and is typically thinner than the laterally adjacent bottom oxide layer 136. Various type of oxides, such silicon dioxide, may be used to implement the oxide layers described herein.

Figure 19:
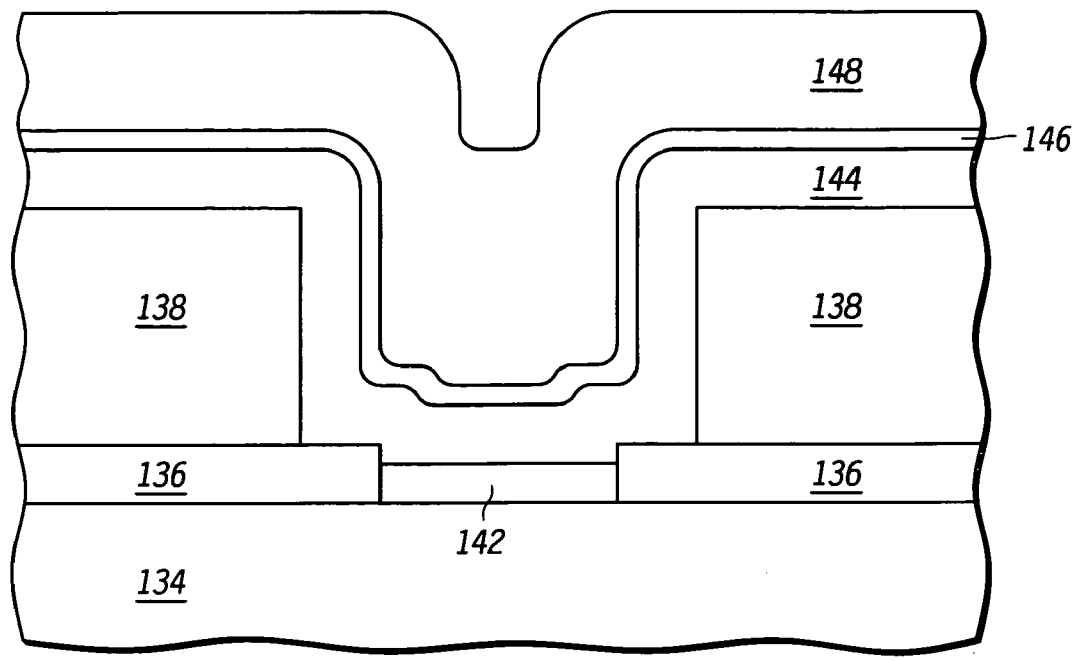

Illustrated in FIG. 19 is further processing of memory cell 132. The sidewall spacers 140 are initially removed. A conformal nitride layer 144 is formed by deposition. In one form the nitride layer 144 is silicon nitride but other nitrides may be used. A top oxide layer 146 is deposited or thermally grown overlying the nitride layer 144. Overlying the top oxide layer 146 is a gate 148. In one form the gate 148 is polysilicon but may implemented with various alternative conductive materials. The gate 148 is formed by a conventional deposition of the polysilicon.

Figure 20:
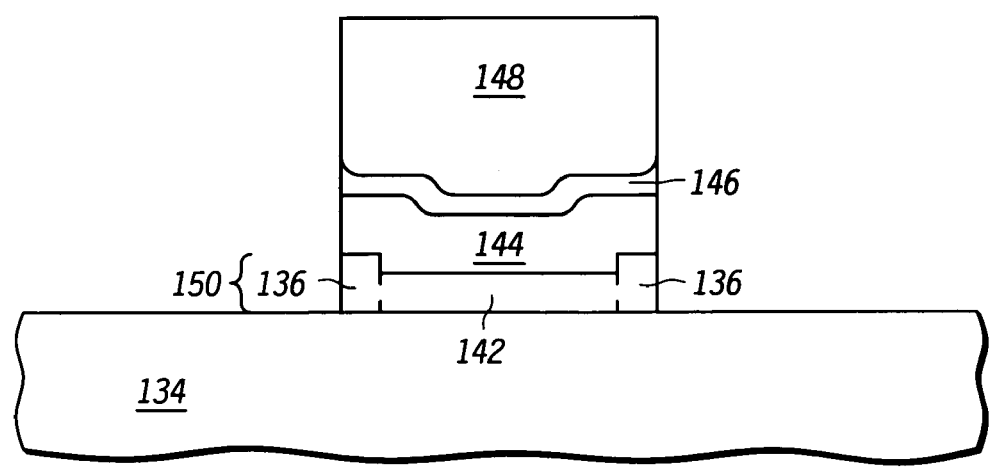

Illustrated in FIG. 20 is further processing of memory cell 132 to create a memory cell in which only a lower gate oxide within a gate stack has a noticeably differing thickness between the center of the gate stack and the edges thereof. Initially the gate 148 is planarized and removed in those portions outside of the original opening 139 by CMP. A mask (not shown) is used to selectively etch the structure of memory cell 132 in FIG. 19 to create a gate stack as illustrated in FIG. 20. It should be noted that a bottom oxide layer 150 has an increased thickness at the outside perimeter thereof due to the fact that the bottom oxide layer 136 was formed thicker than the bottom oxide layer 142. As a result of the cross-sectional profile of the bottom oxide layer 150, memory cell 132 may be reliably programmed using the multiple step programming method described above. Since the reference numbers 136 and 142 both represent an oxide, the interface between the separately formed elements is illustrated with a dashed line in FIG. 20 as the actual device is generally not expected to have a visible interface. Therefore it should be apparent that there has been provided a method and memory cell having a gate with a lower oxide adjacent a substrate having varying thickness and a higher oxide adjacent a gate having substantially the same thickness.

Figure 21:
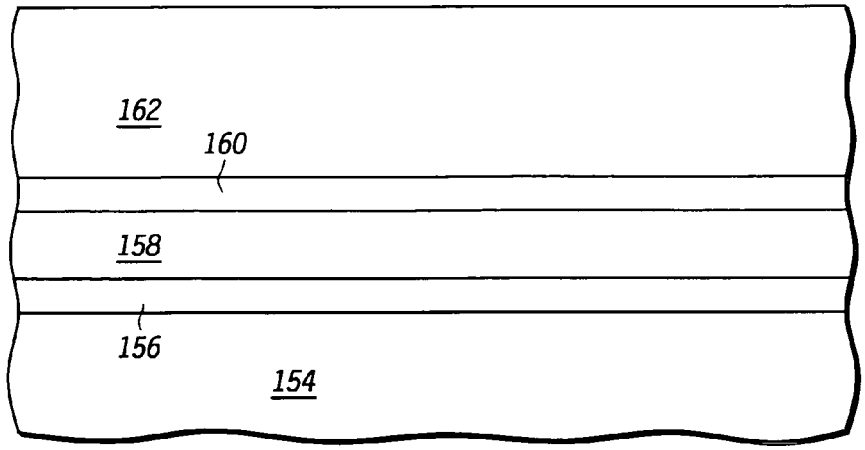
FIGS. 21-25 illustrate in cross-sectional form a memory array in accordance with another form of the present invention using multiple step programming.

Illustrated in FIG. 21 is a memory array 152 formed in accordance with another form of the present invention. A substrate 154 has an overlying bottom oxide layer 156. The substrate 154 may be of various materials and in one form is silicon. The bottom oxide layer 156 may be implemented with various oxide materials and in one form is silicon dioxide. Overlying the bottom oxide layer 156 is a charge storage layer 158. The charge storage layer 158 may be implemented with various materials and in one form is a nitride. Overlying the charge storage layer 158 is a top oxide layer 160. Overlying the top oxide layer 160 is a gate 162. While gate 162 may be implemented with any of various conductive materials, one implementation of gate 162 is with polysilicon.

Figure 22:
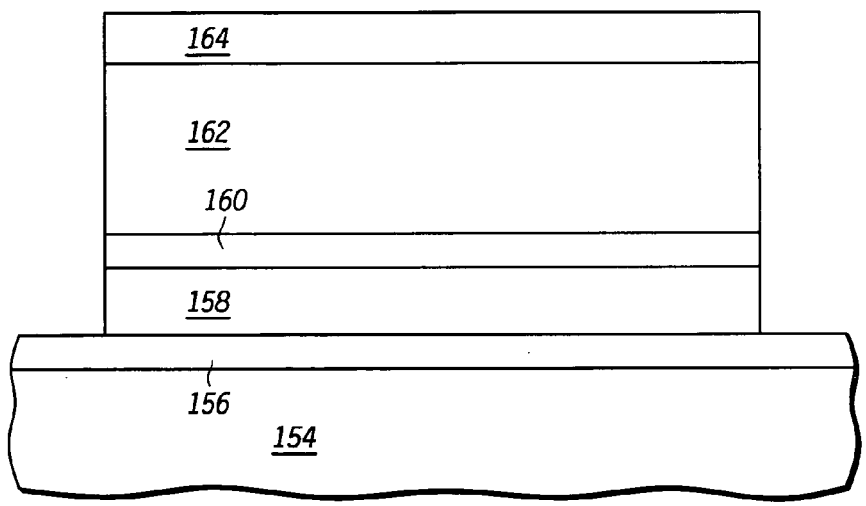

Illustrated in FIG. 22 is further processing of memory array 152. An ARC (antireflective coating) layer 164 is formed overlying the gate 162. The ARC layer 164 is conventionally used to protect underlying layers. A conventional wet etch is performed to remove all portions of the gate 162, the top oxide layer 160 and the charge storage layer 158 where the ARC layer 164 is not present.

Figure 23:
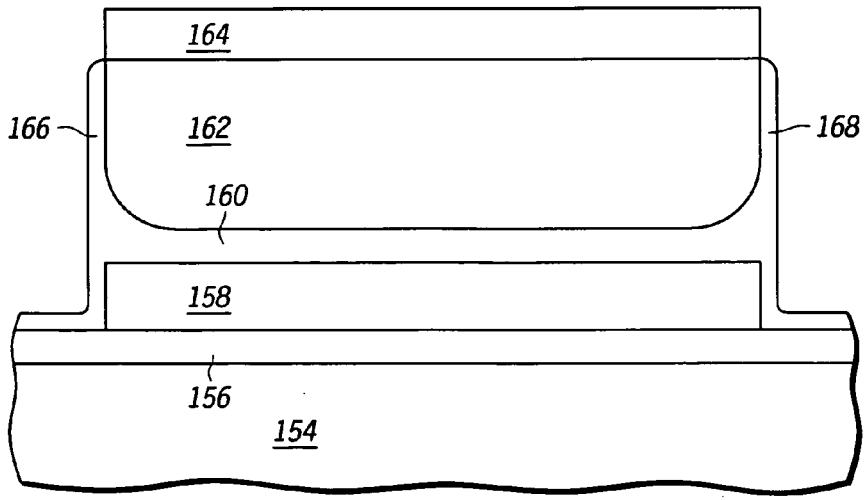

Illustrated in FIG. 23 is further processing of memory array 152. The memory array 152 is subject to an oxidizing ambient to form sidewall oxide liner 166 and sidewall oxide 168 along exposed side surfaces of the gate 162, the top oxide layer 160, the charge storage layer 158 and the exposed top surface of the bottom oxide 156. As a result of the oxidation, the height at the outside perimeter or outer edges of the top oxide layer 160 increases relative to the height in the center area of the top oxide layer 160.

Figure 24:
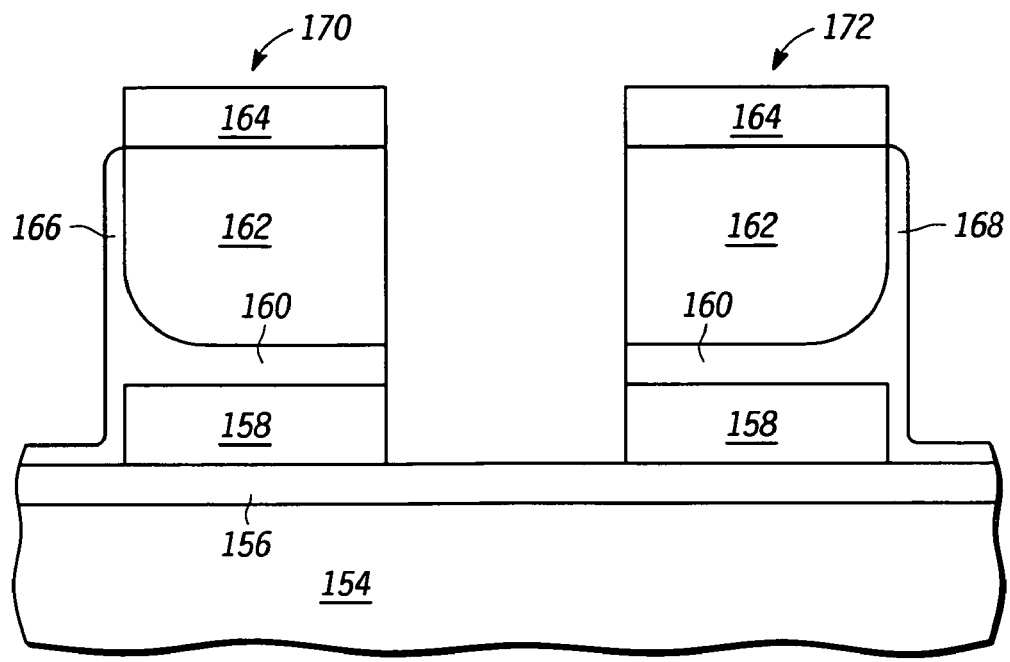
Figure 25:
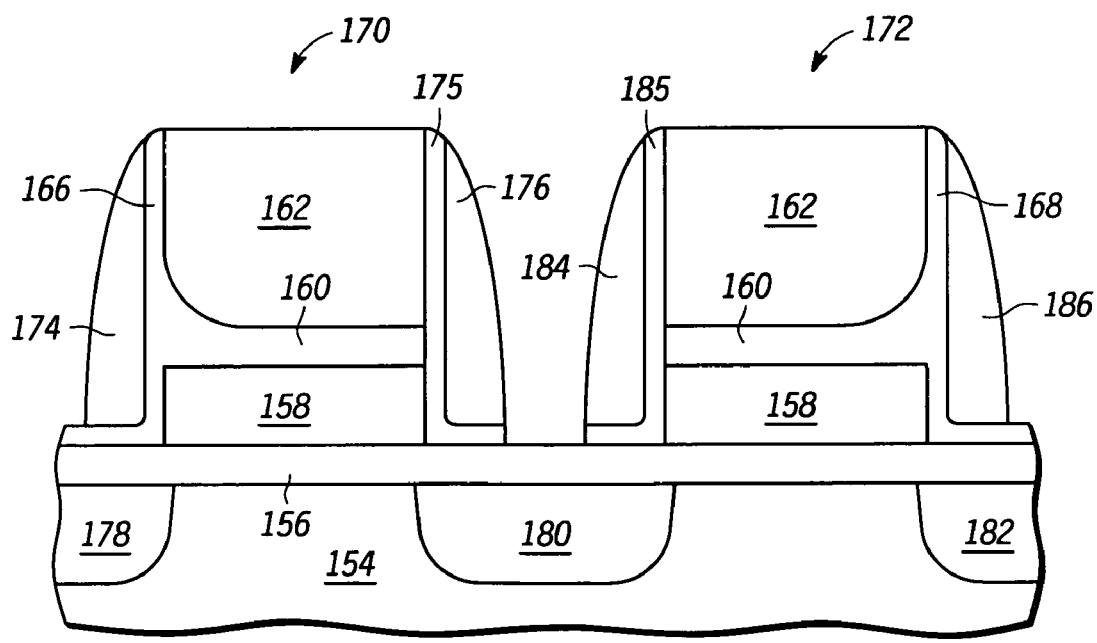

Illustrated in FIG. 24 is further processing of memory array 152. A mask is provided and a conventional wet etch is performed to remove a central portion of the ARC layer 164, the gate 162, the top oxide layer 160 and the charge storage layer 158. The result is the creation of two gate stacks within memory array 152 for respectively forming a memory cell 170 and a memory cell 172. An oxide liner 175 is formed along a first exposed side of gate 162. Similarly, a sidewall oxide liner 185 is formed along a second exposed side of gate 162. A sidewall spacer 174 is formed adjacent the sidewall oxide liner 166, and a sidewall spacer 176 is formed adjacent the sidewall oxide liner 175. A sidewall spacer 184 is formed adjacent the sidewall oxide liner 185, and a sidewall spacer 186 is formed adjacent the sidewall oxide 168. A drain 178 is formed in substrate 154 for memory cell 170. A drain 182 is formed in substrate 154 for memory cell 172. A common source 180 is formed in substrate 154 for both memory cell 170 and memory cell 172.

In operation, each of memory cell 170 and memory cell 172 stores a single bit per memory cell. The charge associated with each stored bit is stored on the side of the charge storage layer 158 where the thicker oxide of top oxide layer 160 exists. Memory cell 170 and memory cell 172 shares the common source 180. Each of memory cell 170 and memory cell 172 is programmed from the side that is opposite the common source 180. If memory cell 170 and memory cell 172 are erased by means of a non-uniform erase mechanism, this structure is useful. The memory cell structure of memory array 152 keeps charge away from the common source 180 and therefore prevents an erroneous read. In other words, erased memory cells do not appear to have been programmed when they were not programmed.

By now it should be apparent that there has been provided various memory cell structures and a programming technique that avoids subsequent erroneous operation. By making a gate oxide of a memory cell have a bird's beak-like structure at the outer perimeter, multiple programming steps will redistribute charge storage primarily in the desired programmed bit and avoid inadvertently programming unintended bits. After HCI programming some electrons may be injected further away from the source and drain of a memory cell than desired. These electrons contribute to the residual charge build-up in the channel of the memory cell. By applying a positive pulse to the gate with respect to the source, drain and substrate in a second programming step, electrons will tunnel out of a charge storage layer and holes will tunnel into the charge storage layer via an intervening insulating layer. As a result residual negative charge in the center of the memory cell is removed. The bird's beak thickness of the oxide at the edges prevents the stored charge in the bit from being significantly modified.

It should be noted that the second programming step described herein applies equally to single-bit per cell memory structures and two-bit per cell memory structures. It should also be noted that it is advantageous to apply the multiple programming step described herein to a large population of memory bits since it is tunneling and is a low current operation. Therefore, the total time to implement the second step is relatively small per bit.

In one form there is herein provided a memory cell with a substrate having a channel region. A first dielectric layer is over the substrate. A charge storage layer is over the first dielectric layer. A second dielectric layer is over the charge storage layer, the second dielectric layer having a first portion thicker than a second portion. The first portion overlies at least a portion of the channel region. A gate electrode is over the second dielectric layer and over the channel region. A first sidewall of the gate electrode is over the first portion of the second dielectric layer. In one form, the second dielectric layer has a third portion thicker than the second portion, the second portion overlies at least a portion of the channel region, and a second sidewall of the gate electrode, opposite the first sidewall, is over the second portion of the first dielectric layer. In another form, the first portion of the second dielectric layer is located adjacent an edge of the second dielectric layer. In yet another form, the first portion is approximately 5 to 10 Angstroms thicker than the second portion. In one form, the charge storage layer is a plurality of discrete storage elements. In another form, the charge storage layer is a nitride. In one form, a first portion of the charge storage layer under the first portion of the second dielectric layer is capable of storing a first value. In another form, a second portion of the charge storage layer is capable of storing a second value. In yet another form, the first dielectric layer has a first portion and a second portion, the first portion is thicker than the second portion, and the first portion overlies at least a portion of the channel region. In one form, the substrate has a first source/drain region and a second source/drain region, the channel region being between the first and second source/drain regions, wherein the first source/drain region is shared with a second memory cell. In one form, the first portion is over at least a portion of the second source/drain region. In another form, the second dielectric layer is an oxide.

In yet another there is herein provided a memory cell that has a substrate having a channel region. A first dielectric layer is over the substrate. The first dielectric layer has a first portion thicker than a second portion and the first portion overlies at least a portion of the channel region. A charge storage layer is over the first dielectric layer. A second dielectric layer is over the charge storage layer. A gate electrode is over the second dielectric layer and over the channel region, wherein a first sidewall of the gate electrode is over the first portion of the second dielectric layer. In another form, the second dielectric layer has a third portion thicker than the second portion. The second portion overlies at least a portion of the channel region, wherein a second sidewall of the gate electrode, opposite the first sidewall, is over the second portion of the second dielectric layer. In another form, the first portion of the first dielectric layer is located adjacent an edge of the first dielectric layer. In yet another form, the first portion is approximately 5 to 10 Angstroms thicker than the second portion. In one form, the charge storage layer has a plurality of discrete storage elements. In another form, the charge storage layer is a nitride. In another form, a first portion of the charge storage layer over the first portion of the first dielectric layer is capable of storing a first value. In yet another form, a second portion of the charge storage layer is capable of storing a second value.

There is also herein provided a memory cell structure having a substrate. A first memory device has a first gate electrode, a first charge storage layer, and a first dielectric layer. The first charge storage layer and the first dielectric layer are between the substrate and the first gate electrode. The first dielectric layer has a first portion that is thicker than a second portion. A second memory device is adjacent the first memory cell. A first source/drain region is shared by the first and second memory devices. In one form, a second source/drain region corresponds to the first memory device, wherein a channel region of the first memory device is located between the first source/drain region and the second source/drain region, wherein the first portion of the first dielectric layer is closer to the second source/drain region than the first source/drain region. In another form the second memory device includes a second gate electrode, second charge storage layer, and a second dielectric layer. In this form, the second dielectric layer and the second charge storage layer are between the substrate and the second gate electrode, and the second dielectric layer has a first portion that is thicker than a second portion.

In the foregoing specification, the invention has been described with reference to specific embodiments. However, one of ordinary skill in the art appreciates that various modifications and changes can be made without departing from the scope of the present invention as set forth in the claims below. For example, the memory cell structures may be implemented as standalone nonvolatile memory or as an embedded memory. Various charge storage materials may be implemented such as nanocluster material in lieu of a nitride charge storing material. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

What is claimed is:

1. A memory cell comprising:
   a substrate having a channel region;
   a first dielectric layer over the substrate having a first portion thicker than a second portion, the first portion overlying at least a portion of the channel region;
   a charge storage layer over the first dielectric layer;
   a second dielectric layer over the charge storage layer, the second dielectric layer having a first portion thicker than a second portion, the first portion overlying at least a portion of the channel region;
   a gate electrode over the second dielectric layer and over the channel region, the gate electrode having a first sidewall and a second sidewall;
   a first sidewall dielectric and a second sidewall dielectric that is continuous with the second dielectric layer and respectively adjacent all of the first sidewall and the second sidewall of the gate electrode, wherein the first sidewall of the gate electrode is over the first portion of the second dielectric layer; and
   a sidewall spacer formed adjacent the first sidewall dielectric and the second sidewall dielectric.

2. The memory cell of claim 1, wherein the second dielectric layer has a third portion thicker than the second portion, the second portion overlying at least a portion of the channel region, wherein a second sidewall of the gate electrode, opposite the first sidewall, is over the second portion of the second dielectric layer.

3. The memory cell of claim 1, wherein the first portion of the second dielectric layer is located adjacent an edge of the second dielectric layer.

4. The memory cell of claim 1, wherein the first portion is approximately 5 to 10 Angstroms thicker than the second portion.

5. The memory cell of claim 1, wherein the charge storage layer comprises discrete storage elements.

6. The memory cell of claim 1, wherein the charge storage layer comprises nitride.

7. The memory cell of claim 1, wherein the first dielectric layer has a first portion and a second portion, the first portion thicker than the second portion, the first portion overlying at least a portion of the channel region.

8. The memory cell of claim 1, wherein the second dielectric layer comprises oxide.

9. The memory cell of claim 1, wherein a first portion of the charge storage layer under the first portion of the second dielectric layer is capable of storing a first value.

10. The memory cell of claim 9, wherein a second portion of the charge storage layer is capable of storing a second value.

11. The memory cell of claim 1, wherein the substrate further comprises a first source/drain region and a second source/drain region, the channel region being between the first and second source/drain regions, wherein the first source/drain region is shared with a second memory cell.

12. The memory cell of claim 11, wherein the first portion is over at least a portion of the second source/drain region.

13. A memory cell comprising:
    a substrate having a channel region;
    a first dielectric layer over the substrate, the first dielectric layer having a first portion at an outer edge thereof that is thicker than a second portion, the first portion overlying at least a portion of the channel region;
    a charge storage layer over the first dielectric layer;
    a second dielectric layer over the charge storage layer, the second dielectric layer having a third portion at an outer edge thereof that is thicker than a fourth portion, the third portion overlying at least a portion of the channel region;
    a gate electrode over the second dielectric layer and over the channel region, wherein a first sidewall of the gate electrode is aligned over the first portion of the first dielectric layer and the third portion of the second dielectric layer, a second sidewall of the gate electrode being aligned over the second portion of the first dielectric layer and the fourth portion of the second dielectric layer;
    a sidewall dielectric that is continuous with the second dielectric layer and laterally adjacent the gate electrode; and
    a sidewall spacer formed adjacent the sidewall dielectric.

14. The memory cell of claim 13, wherein the first portion of the first dielectric layer is located adjacent an edge of the first dielectric layer.

15. The memory cell of claim 13, wherein the first portion is approximately 5 to 10 Angstroms thicker than the second portion.

16. The memory cell of claim 13, wherein the charge storage layer comprises discrete storage elements.

17. The memory cell of claim 13, wherein the charge storage layer comprises nitride.

18. The memory cell of claim 13, wherein a first portion of the charge storage layer over the first portion of the first dielectric layer is capable of storing a first value.

19. The memory cell of claim 18, wherein a second portion of the charge storage layer is capable of storing a second value.

20. A memory cell structure, comprising:
   a substrate;
   a first memory device having a first gate electrode, a first charge storage layer, and a first dielectric layer, the first charge storage layer and the first dielectric layer being between the substrate and the first gate electrode, and the first dielectric layer having a first portion located only on one side of the first dielectric layer that is thicker than a second portion that is a remainder of the first dielectric layer within the first memory device, a sidewall dielectric that is continuous with the first dielectric layer and adjacent the gate electrode, the first memory device having a sidewall spacer formed adjacent the first sidewall dielectric;
   a second memory device adjacent the first memory device; and
   a first source/drain region shared by the first and second memory devices.

21. The memory cell structure of claim 20, further comprising:
   a second source/drain region corresponding to the first memory device, wherein a channel region of the first memory device is located between the first source/drain region and the second source/drain region, wherein the first portion of the first dielectric layer is closer to the second source/drain region than the first source/drain region.

22. The memory cell structure of claim 20, wherein the second memory device includes a second gate electrode, a second charge storage layer, and a second dielectric layer, the second dielectric layer and the second charge storage layer being between the substrate and the second gate electrode, and the second dielectric layer having a first portion located only on one side of the second dielectric layer that is farthest removed from the first memory device and that is thicker than a second portion that is a remainder of the second dielectric layer within the second memory device.

* * * * *